United States Patent [19]
Ito et al.

[11] Patent Number: 5,865,897
[45] Date of Patent: *Feb. 2, 1999

[54] METHOD OF PRODUCING FILM OF NITROGEN-DOPED II-VI GROUP COMPOUND SEMICONDUCTOR

[75] Inventors: Satoshi Ito; Satoshi Taniguchi; Masao Ikeda; Hiroyuki Okuyama; Hironori Tsukamoto; Masaharu Nagai, all of Kanagawa; Koshi Tamamura, Tokyo, all of Japan

[73] Assignee: Sony Corporation, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 596,384
[22] PCT Filed: Apr. 28, 1995
[86] PCT No.: PCT/JP95/00854
§ 371 Date: Feb. 9, 1996
§ 102(e) Date: Feb. 9, 1996
[87] PCT Pub. No.: WO95/34093
PCT Pub. Date: Dec. 14, 1995

[30] Foreign Application Priority Data

Jun. 9, 1994 [JP] Japan ................................. 6-127634

[51] Int. Cl.$^6$ .................................................. H05H 13/00
[52] U.S. Cl. ............................. 118/723 MR; 118/723 ER
[58] Field of Search ..................................... 437/105, 107, 437/126, 133, 234, 965, 987; 148/DIG. 41, DIG. 64; 118/723 MR, 723 ER, 723 R; 250/251; 117/108; 156/345; 204/298.04, 298.36

[56] References Cited

U.S. PATENT DOCUMENTS 4,483,725  11/1984  Chang .
4,800,100  1/1989  Herbots et al. ........................... 437/225
5,398,641  3/1995  Shih ......................................... 437/133
5,506,405  4/1996  Yoshida et al. .......................... 250/251
5,772,759  6/1998  Heime et al. ........................ 117/108 X

FOREIGN PATENT DOCUMENTS 0 475 606 A2  3/1992  European Pat. Off. .
0 568 177 A2  3/1993  European Pat. Off. .
57-5050 B2    1/1982  Japan .
61-32414 A    2/1986  Japan .
05234892      9/1993  Japan .
5-243283 A    9/1993  Japan .
6-314652 A   11/1994  Japan .
7-14765       1/1995  Japan .
7-22343       1/1995  Japan .
7-78839       3/1995  Japan .

OTHER PUBLICATIONS

Ohkawa et al. J. Crystal Growth, vol. 111, (1991) pp. 797–801 "Doping of $N_2$ Acceptors into ZnSe . . . ".

Ohkawa et al Jpn. J. Appl. Physics 30(2A), Feb. 1991, pp. L152–L155.

(List continued on next page.)

Primary Examiner—Thi Dang
Attorney, Agent, or Firm—Hill & Simpson

[57] ABSTRACT

A film of a II-VI group compound semiconductor of at least one of elements belonging to the II group of the periodic table and at least one of elements belonging to the VI group of the periodic table is deposited on a substrate. When the film is deposited on the substrate, a plasma of nitrogen in an excited state is applied to the substrate while removing charged particles from said plasma by a charged particle removing means. The deposited film of a nitrogen-doped II-VI group compound semiconductor has an increased percentage of activated nitrogen atoms and improved crystallinity.

7 Claims, 18 Drawing Sheets

OTHER PUBLICATIONS

T. Ohtsuka et al., Jpn. J. Appl. Phys. 32(2b)(1993) L233 "P–type ZnSe prepared by ECR radiacal beam doping during MBE growth", Feb. 1993.

Solar Cells, vol. 26, No. 3, Mar. 1989, Lausanne Ch, pp. 189–195, XP000008454, Romeo et al, "P–Type CdTe Thin Films Doped During Growth by Neutral High Energy Nitrogen Atoms".

Journal of Crystal Growth, vol. 117, No. 1–4, Feb. 1992, Amsterdam NL, pp. 375–384, Ohkawa et al, "Molecular–beam epitaxial growth of p–and n–type ZnSe homoepitaxial layers".

Journal of Vacuum Science and Technology, Part A, vol. 10, No. 4, Jul./Aug. 1992, New York US, pp. 701–704, XP000296183, Park, "Low–resistivity p–type ZnSe: N grown by molecular beam epitaxy using a nitrogen free–radical source".

Patent Abstracts of Japan, vol. 17, No. 683, 15 Dec. 1993.

FIG.7

|  | Upper layer | Lower layer |
|---|---|---|
| Electric filed | 100V/cm | With No. Electric field |
| Na - Nd | $3.5 \times 10^{17} \, cm^{-3}$ | $2.2 \times 10^{17} \, cm^{-3}$ |
| Nitrogen Concentration [N] | $6.3 \times 10^{17} \, cm^{-3}$ | $1.1 \times 10^{18} \, cm^{-3}$ |
| Activated Percentage (Na - Nd/[N]) | 55% | 20% |

FIG. 9

| Specimen No. | Layer deposited with electric field | | | Layer deposited with no electric field | | |
|---|---|---|---|---|---|---|
| | [Na-Nd] (cm$^{-3}$) | [N] (cm$^{-3}$) | Activated Percentage | [Na-Nd] (cm$^{-3}$) | [N] (cm$^{-3}$) | Activated Percentage |
| 1 | $1.60 \times 10^{17}$ | $1.60 \times 10^{17}$ | 0.5925926 | $1.20 \times 10^{17}$ | $4.50 \times 10^{17}$ | 0.2666667 |
| 2 | $3.5 \times 10^{16}$ | $3.5 \times 10^{16}$ | 0.5 | $4.00 \times 10^{16}$ | $1.5 \times 10^{17}$ | 0.2666667 |
| 3 | $1.7 \times 10^{17}$ | $1.7 \times 10^{17}$ | 0.5483871 | $1.50 \times 10^{17}$ | $5.00 \times 10^{17}$ | 0.3 |
| 4 | $3.50 \times 10^{17}$ | $3.50 \times 10^{17}$ | 0.5645161 | $2.20 \times 10^{17}$ | $1.10 \times 10^{18}$ | 0.2 |
| 5 | $6.00 \times 10^{17}$ | $6.00 \times 10^{18}$ | 0.3333333 | $4.00 \times 10^{17}$ | $1.80 \times 10^{18}$ | 0.2222222 |

FIG.11

|         | 100V/cm                      | With no electric field       |
|---------|------------------------------|------------------------------|
| Mobility | 28.0 cm$^2$/V·s             | 15.6 cm$^2$/V·s             |
| Na-Nd   | 3.1x10$^{17}$ cm$^{-3}$     | 1.8x10$^{17}$ cm$^{-3}$     |
| [N]     | 1.8x10$^{18}$ cm$^{-3}$     | 2.7x10$^{18}$ cm$^{-3}$     |

METHOD OF PRODUCING FILM OF NITROGEN-DOPED II-VI GROUP COMPOUND SEMICONDUCTOR

BACKGROUND OF THE INVENTION

The present invention relates to a method of producing a film of a nitrogen-doped II-VI group compound semiconductor.

Light sources for use in optical recording and/or reproduction of information are requested to generate light beams of shorter wavelengths for increased recording density and reproducing resolution. Semiconductor light-emitting devices for generating light beams of shorter wavelengths include green and blue laser diodes and light-emitting devices. Of particular interest among those semiconductor light-emitting devices is a semiconductor light-emitting device of a II-VI group compound semiconductor having a large energy band gap which is made of at least one of elements belonging to the group II such as Zn, Mg, Cs, Hg, Be, etc. and at least one of elements belonging to the group VI such as S, Se, Te, etc., e.g., a semiconductor light-emitting device having a light-emitting layer of ZnCdSe.

"Electronic Letters" Vol. 29, No. 16, 1993 discloses the continuous oscillation at room temperature with a wavelength of 523.5 nm of a semiconductor light-emitting device which comprises a GaAs substrate and an SCH (Separate Confinement Heterostructure) disposed therein that is comprised of a ZnNgSSc cladding layer, a ZnSSe guide layer and a ZnCdSe active layer.

"Applied Physics Letters" Vol. 57, No. 20, 1990 discloses the fabrication of p-type ZnSe in which Na—Nd is $1 \times 10^{17}$ cm$^{-3}$ (where Na represents an acceptor concentration and Nd a donor concentration) by effecting an MBE (Molecular Beam Epitaxy: Molecular Beam Epitaxy) of a ZnSe layer with a beam of free radicals of nitrogen molecules.

"Japanese Journal of Applied Physics Letters" Vol. 30 No. 2A, 1991 shows that when p-type ZnSe was produced by nitrogen molecule radicals according to the above revealed process, the percentage of activated nitrogen atoms in ZnSe was only 0.2%.

One film producing apparatus for producing a film of a p-type II-VI group compound semiconductor by applying a plasma of nitrogen is an MBE (Molecular Beam Epitaxy:: Molecular Beam Epitaxy) apparatus which is schematically shown in FIG. 17, for example. The MBE apparatus, which is of a type of vacuum evaporation apparatus, has a chamber 40 with a vacuum degree (evacuated down to $10^{-10}$ Torr) by an ultra-high vacuum evacuating device (not shown), the vacuum chamber 40 housing a substrate holder 42 for holding a substrate 41 on which a film of a II VI group semiconductor is formed.

The vacuum chamber 40 supports a plurality of molecular beam sources (K cells) of such a II-VI group compound semiconductor which are directed toward the substrate 41. A plasma generation source 44 is also supported on the vacuum chamber 40 for applying a plasma of nitrogen to the substrate 41. The plasma generation source 44 is in the form of an ECR (Electron Cyclotron Resonance) plasma cell as illustrated. The plasma generation source 44 comprises a plasma generation chamber 44R having magnets 45, a microwave terminal 46 disposed in the plasma generation chamber for supplying a microwave, and a nitrogen gas inlet pipe 47 disposed in the plasma generation chamber for supplying a nitrogen gas.

When molecular beams are applied from the molecular beam source 43 to the substrate 41, a film of a II-VI group compound semiconductor, for example, is epitaxially deposited on the substrate 41. For epitaxial growth of a nitrogen-doped p-type II-VI group compound semiconductor on the substrate 41, a nitrogen gas is converted into a plasma due to electron cyclotron resonance by applying a magnetic filed and a microwave in the plasma generation source 44, and the plasma of nitrogen is applied from a plasma outlet 48 of the plasma generation source 44 to the substrate 41. In this manner, a nitrogen-doped II-VI group semiconductor is epitaxially grown on the substrate 41 upon application of the molecular beams from the molecular beam source to the substrate 41. A preliminary chamber 49 is connected to the vacuum chamber 40 for introducing the substrate 41 into and removing the substrate from the vacuum chamber 40.

The plasma of nitrogen contains ionized $N_2$ ions, N ions, $N_2$ radicals, N radicals and a large number of electrons. It has been reported that the ionized nitrogen N is not activated in a II-VI group semiconductor and does not contribute to electric conductivity ("Journal of Crystal Growth" vol. 86 (1988), p. 329).

It is highly desirable to increase the reliability and service life of a semiconductor light-emitting device, e.g., a semiconductor laser or a light-emitting diodes, of a II-VI group semiconductor described above, e.g., ZnMgSSe, ZnSSe or ZnCdSe. To this end, it is important to lower the defect density and increase the crystallinity.

However, when a plasma of a p-type impurity of nitrogen is applied to dope a II-VI group semiconductor while a film thereof is being deposited, this compound semiconductor has no sufficient crystallinity, which is a bottleneck in increasing the reliability and life time thereof.

As a result of research activities, the inventors have found that when a plasma of nitrogen is applied to dope a II VI group compound semiconductor while a film thereof is being deposited, the application of electrons produced by the generation of the plasma greatly affects the creation of crystal defects. The inventors have also revealed that the existence of $N_2$ ions and N ions which do not contribute to the electric conductivity of a II-VI group compound semiconductor, i.e., which are not activated, is likely to induce crystal defects, and high-speed neutral particles excited by the generation of the plasma cause damage (damage) to the crystal upon collision with a deposited semiconductor film. For example, the spectrum of light emitted at 77° K from a p-type ZnSe crystal that is deposited on a GaAs substrate and doped with nitrogen by a plasma of nitrogen includes a light emission, referred to as a Y-line, due to a crystal defect, as well as a band-end emission which indicates nitrogen incorporated as an acceptor, as shown in FIG. 18. However, the spectrum of light emitted from a ZnSe crystal that is grown simply in nitrogen includes no Y-line as shown in FIG. 19. It can therefore be seen that the Y-line is produced by a plasma of nitrogen.

SUMMARY OF THE INVENTION

In forming a film of a p-type II-VI group compound semiconductor, it is an object of the present invention to provide a method of producing a film of a nitrogen-doped II-VI group compound semiconductor while effectively reducing crystal defects thereof to increase the crystallinity thereof, so that the method is applied to the fabrication of a green or blue semiconductor light-emitting device, i.e., a semiconductor laser or a light-emitting diode, the reliability and life time thereof can be increased.

It has heretofore been reported that the crystallinity of a II-VI group semiconductor can be increased by positively applying electrons while its crystal is being grown.

According to a first invention, when a film of a II-VI group compound semiconductor of at least one of elements belonging to the II group of the periodic table and at least one of elements belonging to the VI group of the periodic table is formed on a substrate, a plasma of nitrogen in an excited state is applied to the substrate while removing charged particles from the plasma by deflection or elimination, thereby a film of a desired compound semiconductor being formed.

According to a second invention, high-speed neutral particles directly oriented toward the substrate are removed at the same time the charged particles are removed from the plasma.

According to a third invention, the charged particles are deflected or eliminated by an electric field applying means.

According to a fourth invention, the electric field is applied in a range from 1 V/cm to 1 Kv/cm.

According to a fifth invention, the electric field is applied in a direction across the direction in which the plasma of nitrogen is applied to the substrate.

According to a sixth invention, the electric field is applied by a pair of electrodes in a direction across the direction in which the plasma of nitrogen is applied to the substrate.

According to a seventh invention, the electric field is applied by a mesh electrode disposed across the direction in which the plasma is applied to the substrate.

According to an eighth invention, the compound semiconductor contains at least Zn of elements belonging to II group of the periodic table and Se of elements belonging to VI group of the periodic table.

According to a ninth invention, the charged particles are deflected or eliminated by applying a magnetic field.

According to a tenth invention, when a film of II-VI group compound semiconductor containing at least Zn and Se is formed on a substrate, a plasma of nitrogen in the excited state is applied to the substrate to activate nitrogen atoms in the deposited film to a percentage of at least 50%.

According to an eleventh invention, when a film of II-VI semiconductor containing at least Zn and Se is formed on a substrate, a plasma of nitrogen that is excited by ECR (Electron Cyclotron Resonance) is applied to the substrate to activate nitrogen atoms in the deposited film of the compound semiconductor to a percentage of at least 50%.

According to a twelfth invention, when a film of II-VI semiconductor containing at least Zn and Se is formed on a substrate, a plasma of nitrogen in the excited state is applied to the substrate to activate nitrogen atoms to a percentage of at least 50% while the film of the compound semiconductor has an effective acceptor concentration which is equal to at most a saturated concentration.

According to a thirteenth invention, the plasma of nitrogen is applied to the substrate while charged particles are being removed from the plasma by deflection or elimination.

According to a fourteenth invention, the compound semiconductor is ZnSe.

In the methods of forming a film of nitrogen-doped II-VI compound semiconductor according to the present invention, the percentage of activated nitrogen atoms in the deposited film is increased, and the nitrogen-doped II-VI compound semiconductor has excellent crystallinity. It appears that the percentage of activated nitrogen atoms can be increased and the crystallinity can be improved because the removal of at least charged particles directed toward the substrate is effective to prevent unnecessary nitrogen ions and many electrons which are produced upon generation of the plasma and are not involved in the electric conductivity of the deposited film, i.e., are not activated, from being oriented toward the substrate and hence from being introduced into or colliding with the deposited film, thereby avoiding introduction of unnecessary foreign matters between the atoms of the crystal and hence breakage of the crystal.

BRIEF DESCRIPTION OF DRAWINGS

FIG. 7 is a table of properties of deposited films of a nitrogen-doped II-VI group compound semiconductor with and without the application of an electric field;

FIG. 9 is a table of properties of deposited films of a nitrogen-doped II-VI group compound semiconductor with and without the application of an electric field;

FIG. 11 is a table of properties of deposited films of a nitrogen-doped II-VI group compound semiconductor with and without the application of an electric field;

DETAILED DESCRIPTION OF THE PREFERRED EMBODIMENTS

Figure 1:
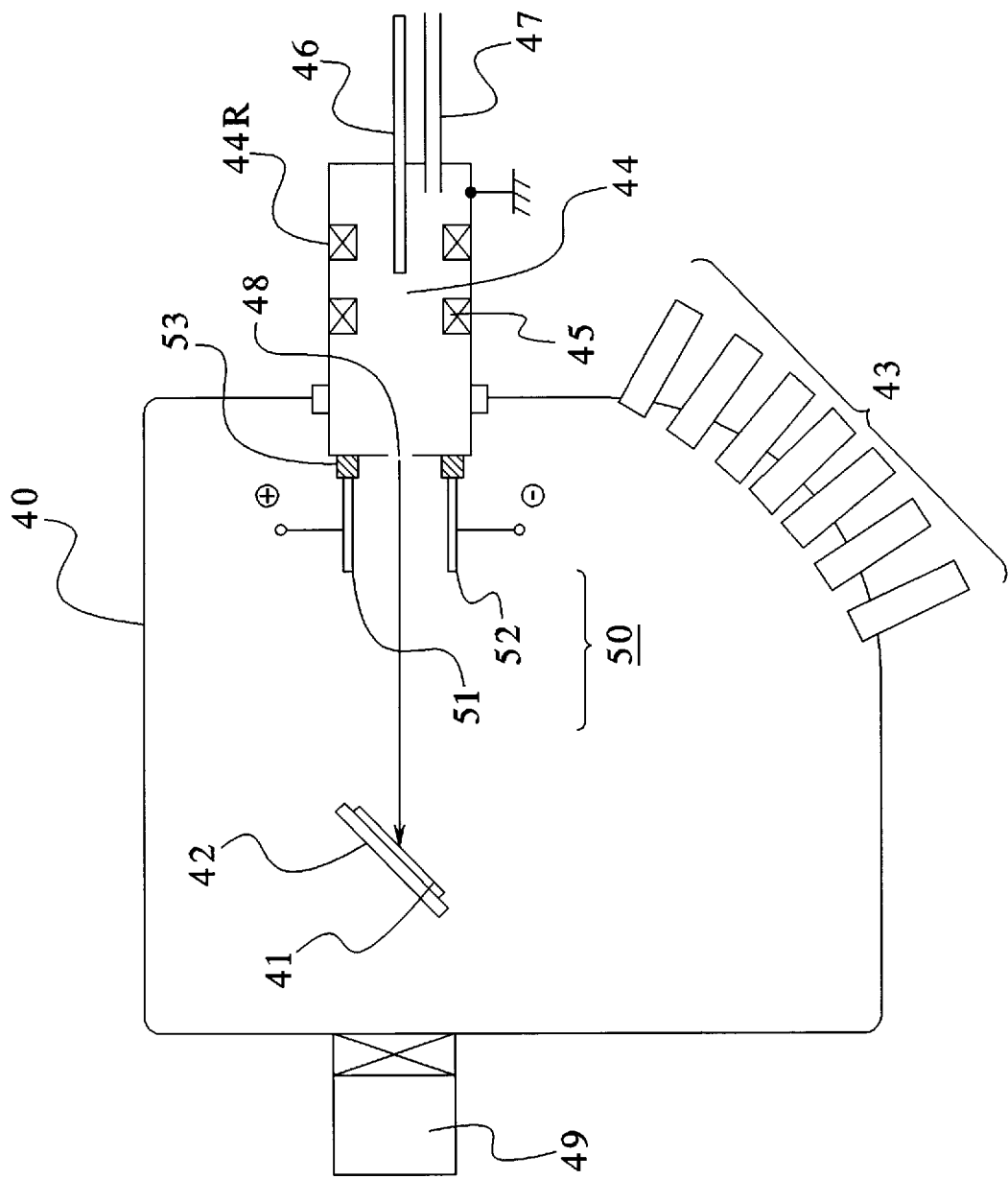
FIG. 1 is a schematic view of an apparatus for carrying out a method of producing a film of a nitrogen-doped II-VI group compound semiconductor according to the present invention.

FIG. 1 is a diagram showing an MBE apparatus for carrying out a method of producing a film of a nitrogen-doped II-VI group compound semiconductor according to the present invention. Also in this case, the above apparatus has a plasma 10 generation source 44 in the form of an ECR plasma cell—Those parts in FIG. 1 are denoted by identical reference numerals.

Figure 2:
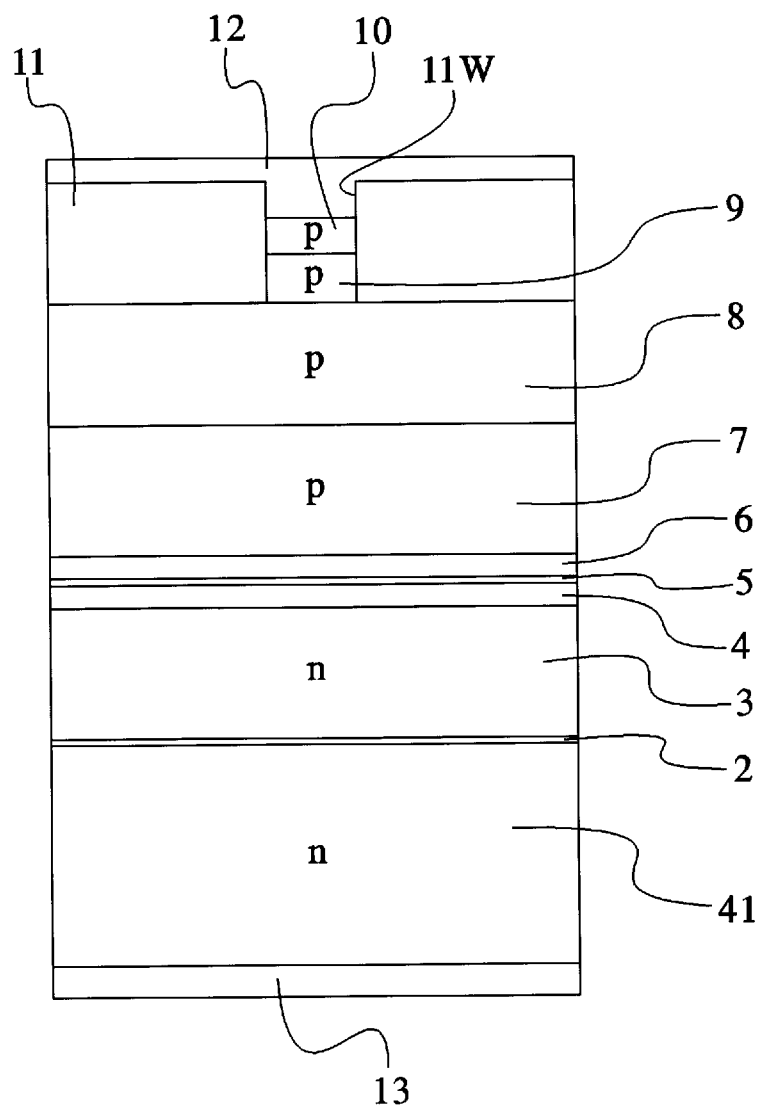
FIG. 2 is a schematic cross-sectional view of a semiconductor light-emitting device which is fabricated by the method of forming a film of a nitrogen-doped II-VI group compound semiconductor according to the present invention.

FIG. 2 is a schematic cross-sectional view illustrating a II-VI group compound semiconductor light-emitting device which is fabricated by the method according to the present invention. This compound semiconductor light-emitting device is of an SCH (Separate Confinement Hetereostructure). However, the present invention is also applicable to the formation of a film of a nitrogen-doped II-VI group compound semiconductor which may be any of various structures and compositions.

In FIG. 2, there are formed, successively on a substrate 41, e.g., a GaAs substrate of an n-type III-V group compound, a buffer layer 2 of GaAs, ZnSe, or/and ZnSSe, an n-type first cladding layer 3 of ZnMgSSe doped with an n-type impurity of Cl, a first guide layer 4 of ZnSSe, e.g., $ZnS_{0.6}Se_{0.94}$, an active layer (light-emitting layer) 5 of ZnCdSe, e.g., $Zn_{0.85}Cd_{0.15}Se$, a second guide layer 6 of ZnSSe, e.g., $Zn_{0.06}Se_{0.94}$, a p-type second cladding layer 7 of ZnMgSSe doped with a p-type impurity of nitrogen, a capping layer 8 of ZnSe doped with nitrogen, a superlattice layer 9 comprising a repetitive laminated structure composed of a thin-film layer of ZnSe and a thin-film layer of ZnTe, and an electrode contact layer 10 or ZnTe doped with nitrogen, by an MBE growth process.

The surface formed thus far is then selectively etched away to define grooves down to the surface of the capping layer 8, leaving a strip of the electrode contact layer 10 and the superlattice layer between the grooves. The grooves are thereafter filled up with an insulating layer 11 of polyimide or the like. The insulating layer 11 has an electrode window 11W through which the strip-shaped electrode contact layer 10 is exposed outwardly. Through the electrode window 11W, the electrode contact layer 10 is held in ohmic contact with a p-side electrode 12 having a multilayer structure of Pd, Pt, and Au, for example.

An n-side electrode 13 of In, for example, is deposited on the reverse side of the substrate 41 in ohmic contact therewith.

In this manner, a semiconductor light-emitting device, e.g., a semiconductor laser for emitting green or blue light or a light-emitting diode, is fabricated.

The principles of the present invention are applied to the fabrication of a semiconductor light-emitting device through the formation of a film of such a nitrogen-doped II-VI group compound semiconductor.

Figure 17:
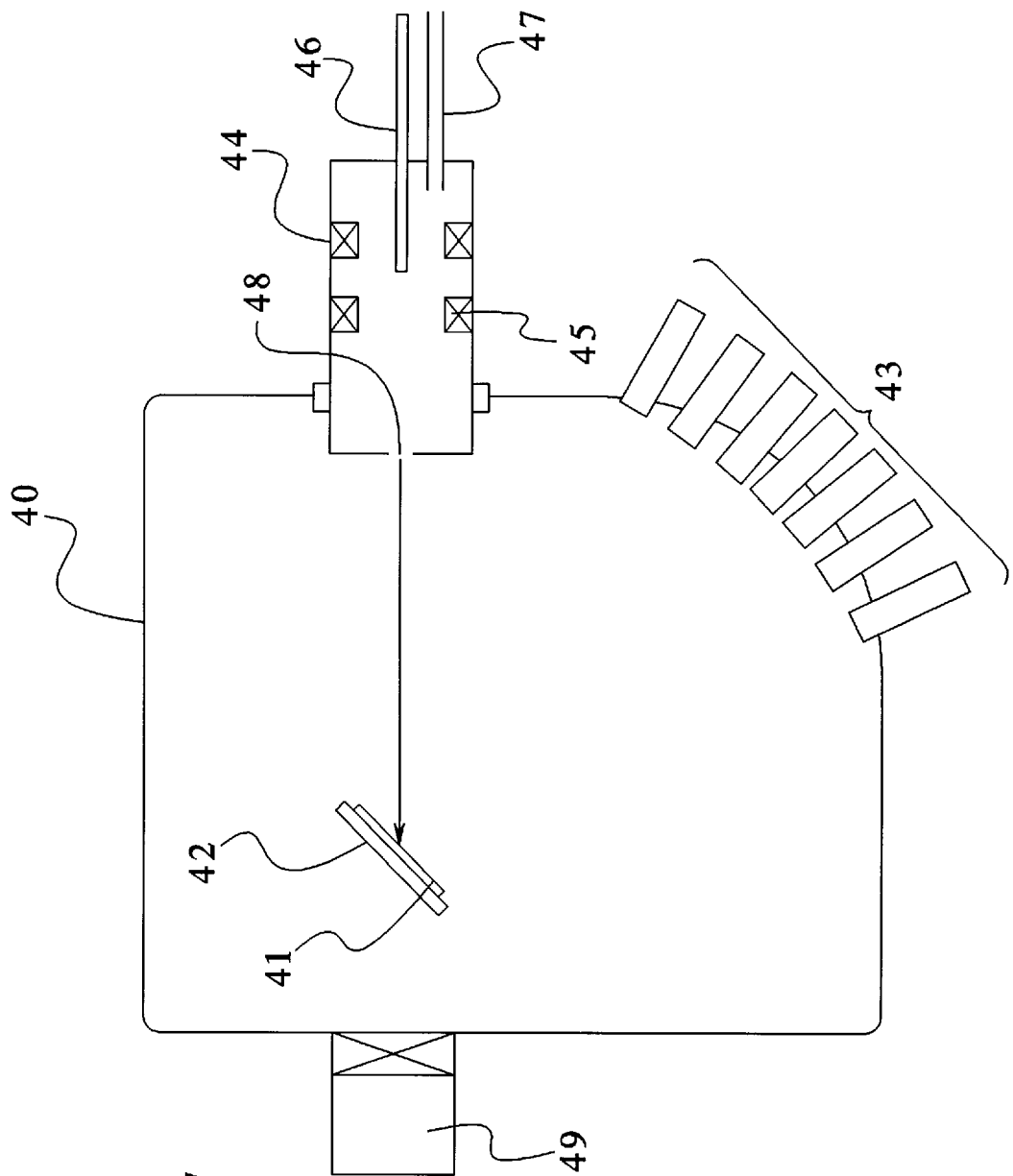
FIG. 17 is a schematic view of an apparatus for carrying out a conventional method of producing a film of a compound semiconductor.
Figure 18:
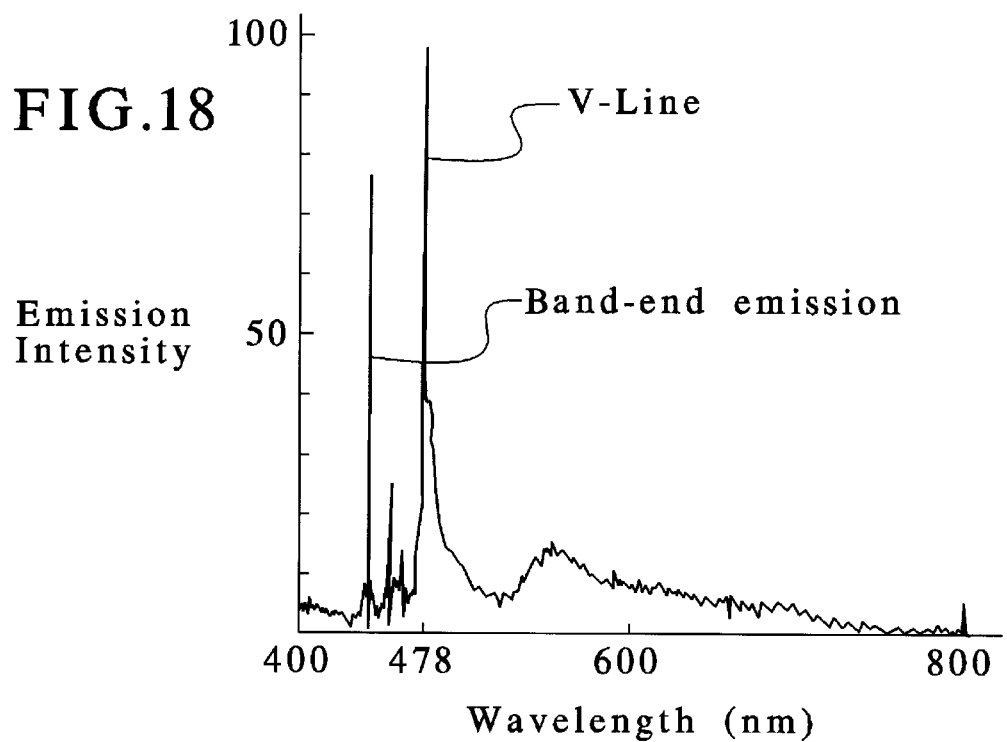
FIG. 18 is a diagram showing the spectrum of light emitted according to the conventional method.
Figure 19:
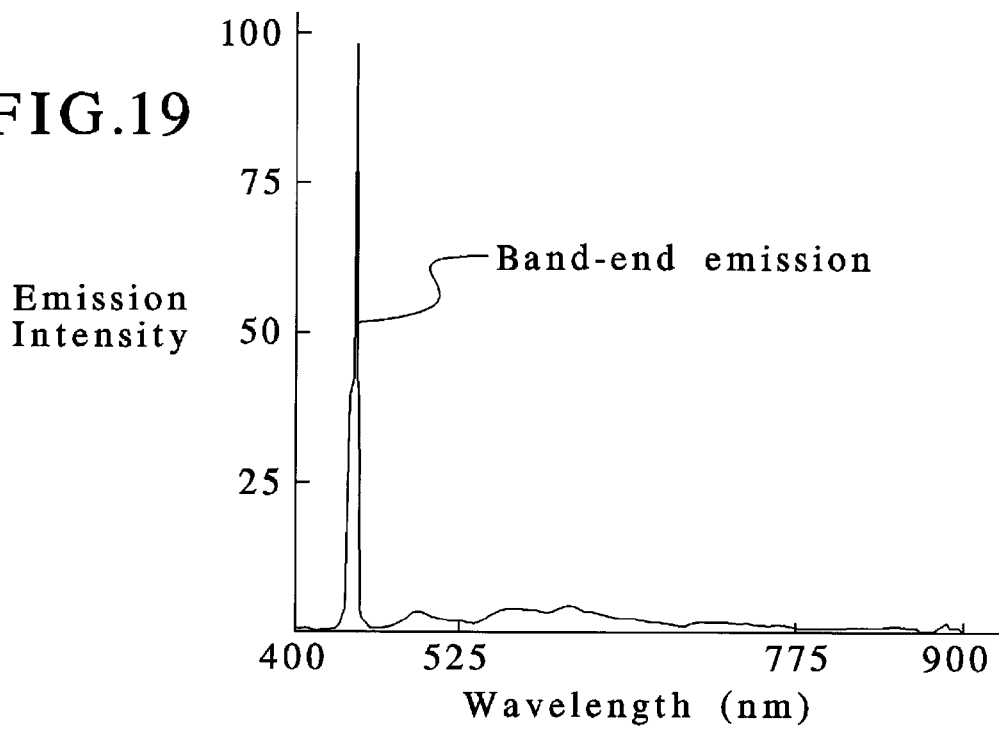
FIG. 19 is a diagram showing the spectrum of light emitted according to a comparative method.

As shown in FIG. 1, i.e., in the same manner as that of FIG. 17, the apparatus for carrying out the method of producing a film of a nitrogen-doped II-VI group compound semiconductor according to the present invention has a vacuum chamber 40 that can evacuated to a pressure of down to $10^{-10}$ Torr by an ultra-high vacuum evacuating device (not shown), the vacuum chamber 40 housing a substrate holder 42 for holding a substrate 41 on which a film of a nitrogen-doped II-VI group compound semiconductor is to be formed, e.g., for holding a GaAs substrate if the compound semiconductor light-emitting device shown in FIG. 2 is to be fabricated. A preliminary chamber 49 is connected to the vacuum chamber 40 for introducing the substrate 41 into and removing the substrate from the vacuum chamber 40.

The vacuum chamber 40 supports a plurality of molecular beam sources (K cells) 43 of such a II-VI group compound semiconductor which are directed toward the substrate 41. If the semiconductor light-emitting device shown in FIG. 2 is to be fabricated, then the molecular beam sources 43 include molecular beam sources of semiconductor materials in the II and VI groups, i.e., Zn, Se, Mg, ZnS, Te, and Cd, and a molecular beam source of an n-type impurity of Cl, i.e., $ZnCl_2$. The buffer layer 2, the first cladding layer 3, the first guide layer 4, the active layer 5, the second guide layer 6, the second cladding layer 7, the capping layer 8, the superlattice layer 9 and the electrode contact layer 10, i.e., the II-VI group semiconductor layers, are successively epitaxially deposited on the substrate 41 by selectively switching on and off molecular beams applied from the molecular beam sources 43 to the substrate 41.

A plasma generation source 44 is also supported on the vacuum chamber 40. The plasma generation source 44 comprises a plasma generation chamber 44R. The plasma generation chamber 44R has a plasma outlet 49 opening into the vacuum chamber 40 for applying a plasma of nitrogen to the substrate 41. The plasma generation source 44 is in the form of an ECR cell, for example, and has magnets 45 disposed in the plasma generation chamber 44R, a microwave terminal 46 disposed in the plasma generation chamber for supplying a microwave, and a nitrogen gas inlet 47 disposed in the plasma generation chamber for supplying a nitrogen gas.

The plasma generation chamber 44R, the vacuum chamber 40 and the substrate holder 42 are maintained in the ground potential, or the plasma generation chamber 44R is insulated from the vacuum chamber and the substrate holder, and a negative potential of—several 10s of Volts, i.e., –50 V, with respect to the ground potential is applied to the plasma generation chamber.

When p-type semiconductor layers are to be deposited, i.e., when nitrogen-doped II-VI group compound semiconductor layers including the second guide layer 6, the second cladding layer 7, the capping layer 8, the electrode contact layer 10 of the semiconductor light-emitting device shown in FIG. 2, are to be epitaxially deposited, the plasma generation source converts a nitrogen gas into a plasma due to electron cyclotron resonance by applying a magnetic field and a microwave in the plasma generation source. The plasma of nitrogen is then applied from the plasma generation source to the substrate 41 for epitaxially depositing nitrogen-doped, i.e., p-type group compound semiconductor layers on the substrate 41 upon application of the molecular beams from the molecular beam sources 43 to the substrate.

In the method according to the present invention, a means for deflecting or eliminating charged particles (hereinafter referred to as a "charged particle removing means") 50 is disposed between the plasma generation source 44 and the substrate 41 in the vicinity of the plasma outlet 48. The excited plasma of nitrogen generated by the plasma generation source 44 is applied to the substrate 41 while charged particles in the plasma are being eliminated by the charged particle removing means. Specifically, while nitrogen radicals in the plasma of nitrogen are on their way toward the substrate 41, the charged particle removing means deflects or draws charged particles, e.g., $N_2+$ ions, N+ ions, and electrons to remove them out of the plasma passage between the plasma outlet 49 and the substrate 41, so that only the nitrogen radicals of excited neutral particles which have not electric charges are applied to the substrate 41 to dope a film of a II-VI group compound semiconductor while it is being deposited.

The charged particle removing means 50 may comprise a means for applying an electric field.

Figure 3:
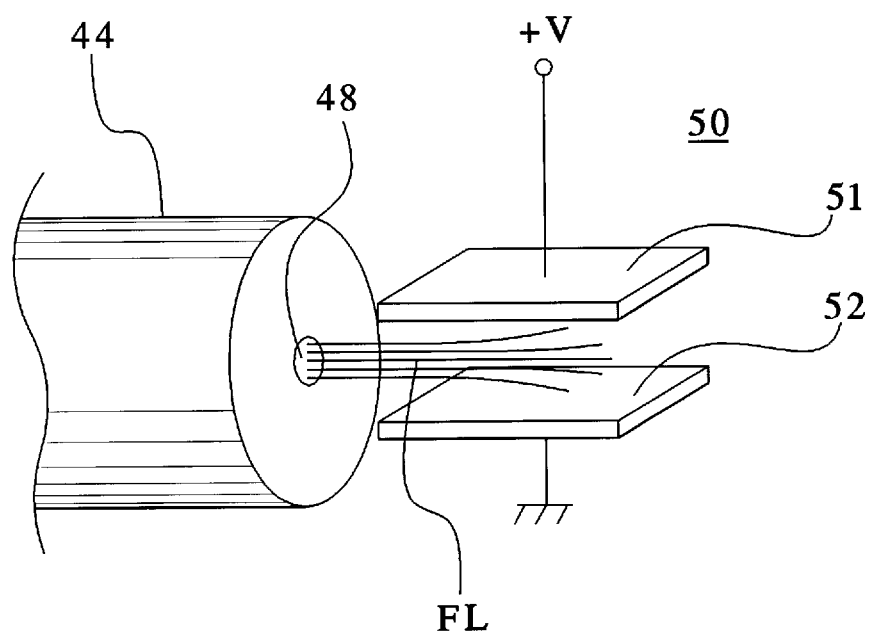
FIG. 3 is a schematic perspective view of a portion of an apparatus for carrying out a method of producing a film of a nitrogen-doped II-VI group compound semiconductor according to the present invention.

As shown in FIG. 1 and FIG. 3, which is a perspective view of a main portion of the electric field applying means, such an electric field applying means comprises a pair of planar electrodes 51, 52 disposed one each side of the plasma passage (plasma fluxes FL) parallel to each other and also to the direction in which the plasma is applied, for example, applying an electric field across the direction in which the plasma is applied to the substrate, i.e., across the plasma fluxes FL, e.g., perpendicularly to the plasma fluxes. A predetermined voltage is applied between the electrodes 51 and 52 to generate an electric field in the range of from 1 V/cm to 1 Kv/cm between the two electrodes. The above electric field range has been selected because if the electric field were lower than 1 V/cm, then charged particles would not sufficiently be deflected or eliminated, and if the electric field were in excess of 1 kV/cm, then the problem of an electric discharge would be posed.

As shown in FIG. 1, for example, the electrodes 51, 52 are fixed in an electrically insulated fashion to the plasma generation source 44, i.e., the ECR cell, by insulators 53 of quartz, alumina, boron nitride, or the like.

Figure 4:
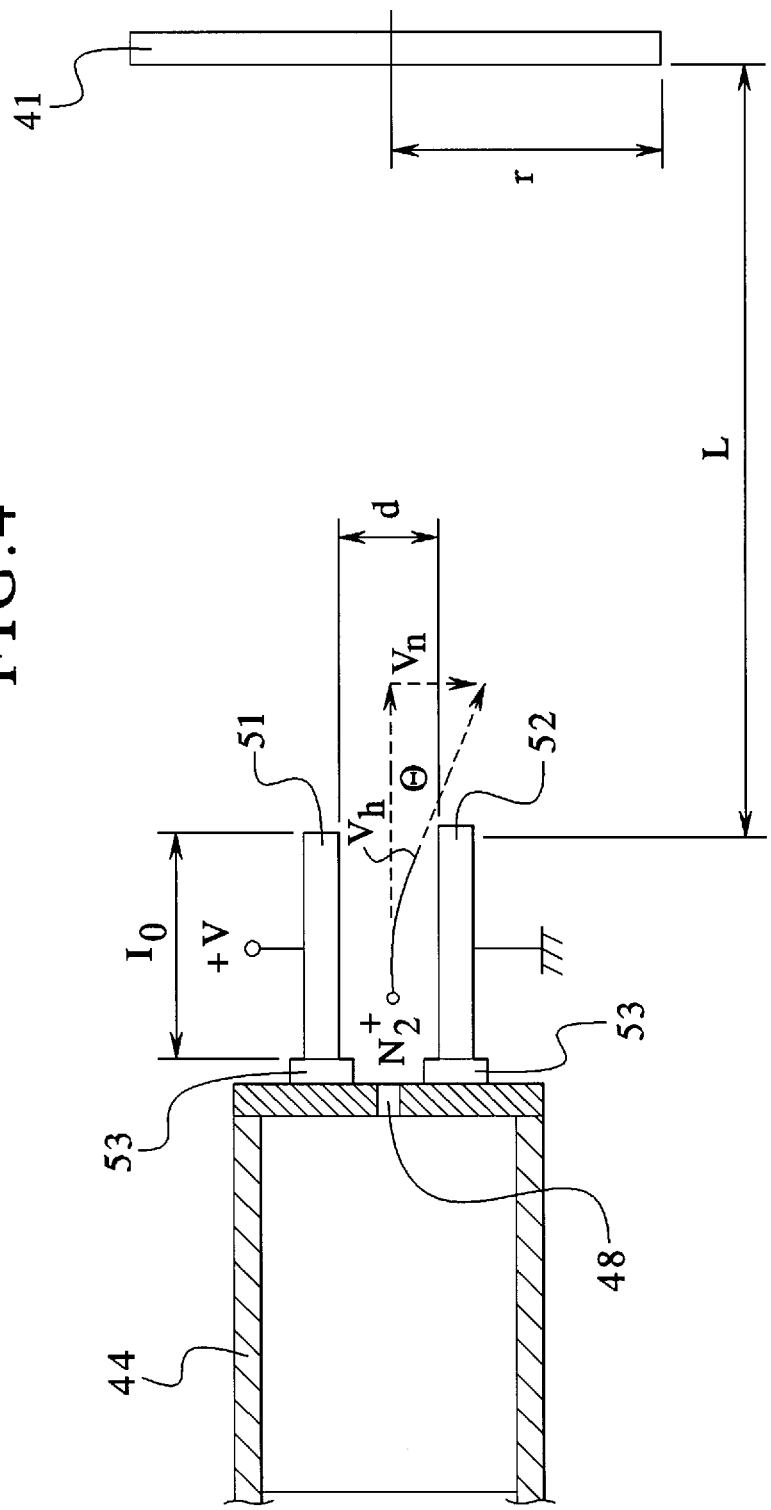
FIG. 4 is a diagram illustrative of the manner in which an electric field is applied in the method of forming a film of a nitrogen-doped II-VI group compound semiconductor according to the present invention.

The electric field applying means 50 as the charged particles removing means in the apparatus according to the present invention will be described in detail with reference to a schematic view of FIG. 4.

For the sake of brevity, it is assumed that $N_2+$ ions are deposited perpendicularly to the substrate, the velocity of molecule is represented by a mean thermal velocity according to the Maxwell-Boltzmann (Maxwell-Boltzmann) distribution, and no other ion types than the $N_2+$ ions exist. As shown in FIG. 4, an $N_2+$ plasma generated by the plasma generation source 44 is discharged from the plasma outlet 48, and when $N_2+$ ions contained in the nitrogen plasma pass between the parallel electrodes 51, 52 with a length of $l_0$ that are spaced a distance "d" from each other, they are attracted toward the negative electrode under the Coulomb force produced by an electric field E developed by the two electrodes. Now, it is assumed that a single $N_2+$ ion is discharged from the plasma outlet and travels between the electrodes 51 and 52 where the electric field E is applied, toward the substrate.

If the horizontal speed at which the ion is discharged from the plasma cell is represented by Vh and the speed of the ion in the direction perpendicular to the electrode at the time it is accelerated by the electric field is represented by Vn, then the angle Θ through which the ion is deflected is indicated by the following equation (1):

$$\tan \Theta = Vn/Vh \quad (1)$$

If the distance from the tip ends of the electrodes of the plasma generation source to the substrate 41 is represented by L and the radius of the substrate 41 is represented by r, then the angle through which the ion is deflected in order to bend the path of the ion from the center of the substrate outwardly off the outer circumferential edge of the substrate 41 should satisfy the following equation (2):

$$\tan \Theta > r/L \quad (2)$$

The speeds Vn, Vh will be determined as follows: The mean thermal velocity Vth of a molecule which is in thermal motion according to the Maxwell-Boltzmann distribution in a certain state of thermal equilibrium is equal to Vh, and given by the following equation (3):

$$Vth = (2/\sqrt{\pi})\sqrt{(2kT/m)} \quad (3)$$

where k is the Boltzmann constant, T is the absolute temperature, and m is the mass of molecule. Therefore, if the mass of $N_2$ is put in "m" in the above equation, then a mean thermal velocity can be determined with respect to different absolute temperatures T.

The speed Vh of the molecule as it travels toward the electrode upon being accelerated by the electric field E will be described as follows:

The force F which an ion having an electric charge "q" receives from the electric field is F=qE. Ignoring the end effect of the electrode plates, the $N_2+$ ion is affected by the electric field only for a time Δt in which the ion passes through the electric field. Therefore, the impulse over the time Δt determines the speed Vn of the $N_2+$ ion. The speed is therefore given by the following equation (4):

$$Vn = (qE/m)\Delta t \quad (4)$$

where $q=1.602 \times 10^{-19}$[C]. Since E=V/d and $\Delta t = l_0/r_0$ where V is the applied voltage, the equations (1), (3), and (4) are combined into the following equation (5):

$$\tan \Delta = (ql_0V)/(mdVn^2) = (q\pi l_0V)/(8kTd) \quad (5)$$

From the equation (2), the condition to be met for bending the trajectory of the ion is given as the following equation (6):

$$(q\Delta l_0V)/(8kTd) > r/L \quad (6)$$

If $l_0=2$ cm, d=1 cm, r=2.54 cm and L=20 cm, and $k=1.38 \times 10^{-23}$ J/K, then the angle of molecule is calculated as follows:

$$\tan \Theta = 9.117 \times 10^{3} \cdot V/T \quad (7)$$

The ratio r/L is given as r/L=9.127, and hence Θ=7.24°. If the temperature of the plasma is 10000 k (about 0.9 eV), then angle of deflection is Θ=42.26° at the applied voltage V=1 [V] (the electric field E=100 [V/m]), and the condition is satisfied. Glow discharge generally have a temperature of about several eV (several tens of thousands °K), and the temperature of a plasma generated by the ECR plasma generation source is considered to be of the same order. The velocity of the molecule has been approximated above by the mean thermal velocity. However, considering the fact that the actual velocity is distributed several times greater than the mass velocity, the Maxwell-Boltzmann distribution should be studied for a strict analysis.

Figure 5:
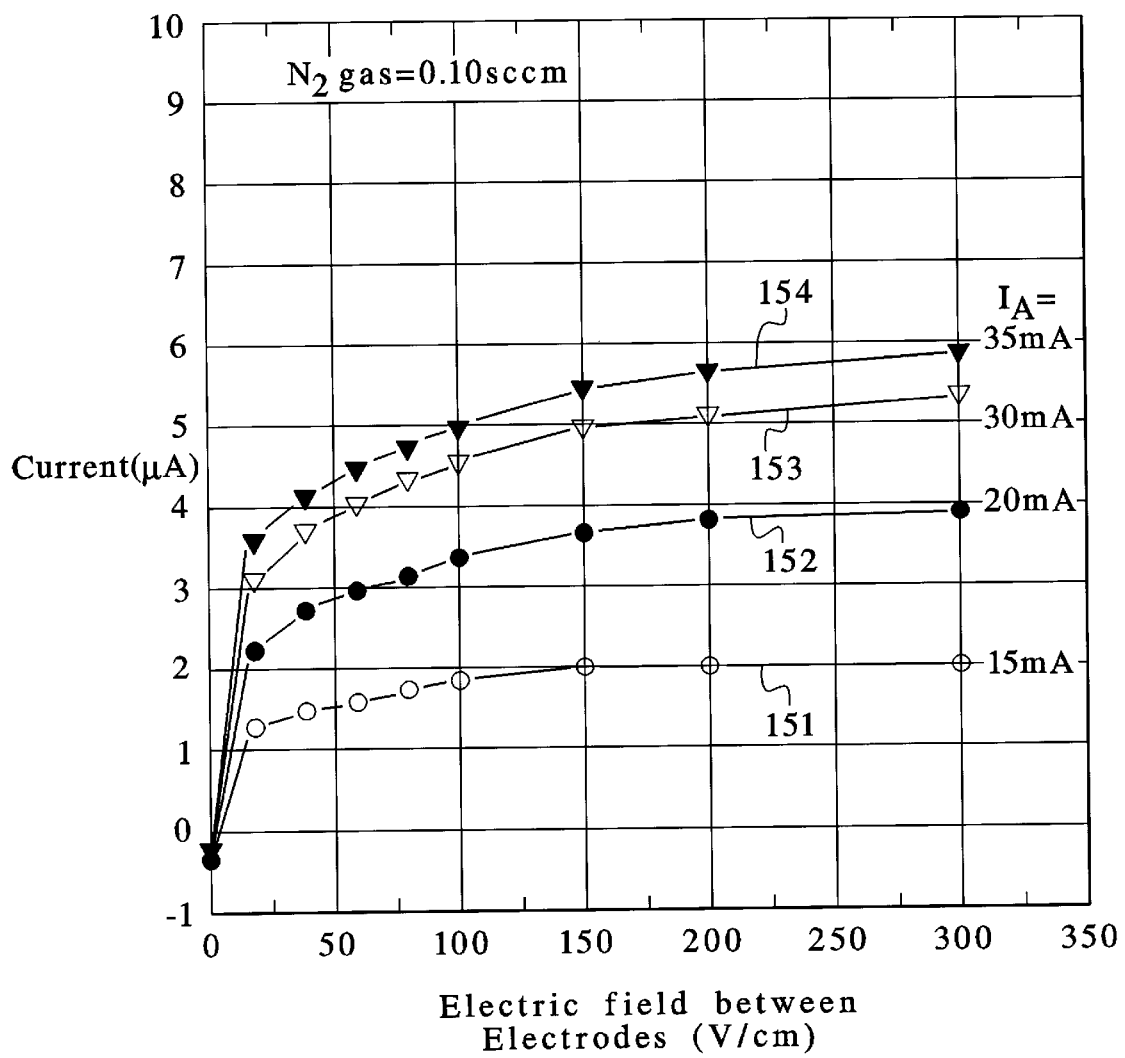
FIG. 5 is a graph showing the relationship between measured electric fields and electrodes in the method of forming a film of a nitrogen-doped II-VI group compound semiconductor according to the present invention.

FIG. 5 shows measured currents flowing between the electrodes 51 and 52 when a plasma is actually generated and electric fields are produced between the electrodes 51 and 52. In this case, the flow rate of an $N_2$ gas is 0.10 sccm and the plasma outlet has a diameter of 0.5 mm. The current flowing between the two electrodes depends on the type of ions captured by the electrodes, and the magnitude of the current is proportional to the number of types of ions captured by the electrodes.

It can be seen from FIG. 5 that about 60% of charged particles are captured by the electrodes when the electric field between the electrodes is about 20 V/cm, and an electric field of 100 V/cm or greater is required to remove most charged particles by capturing them. However, the capability to deflect charged particles so as not to reach the substrate 41 can be reached by an electric field of at least 1 kV/cm and less than 100 V/cm, preferably by about 10 V/cm or higher. If the electric field exceeded 1 kV/cm, the problem of electric discharge would be posed. While the number of ions captured by the electrodes varies depending on the diameter of the plasma outlet, the rate of flow of the $N_2$ gas, and the anode current IA of the plasma generation source, it has been confirmed that substantially similar curves 151, 152, 153, 154 shown in FIG. 5 are plotted when the anode current IA=15 mA, 20 mA, 30 mA, 35 mA, respectively.

The results of an experiment in which an electric field of 100 V/cm or higher was applied between the electrodes to deposit a ZnSe film according to the MBE growth and it was doped with nitrogen will be described below.

Figure 6:
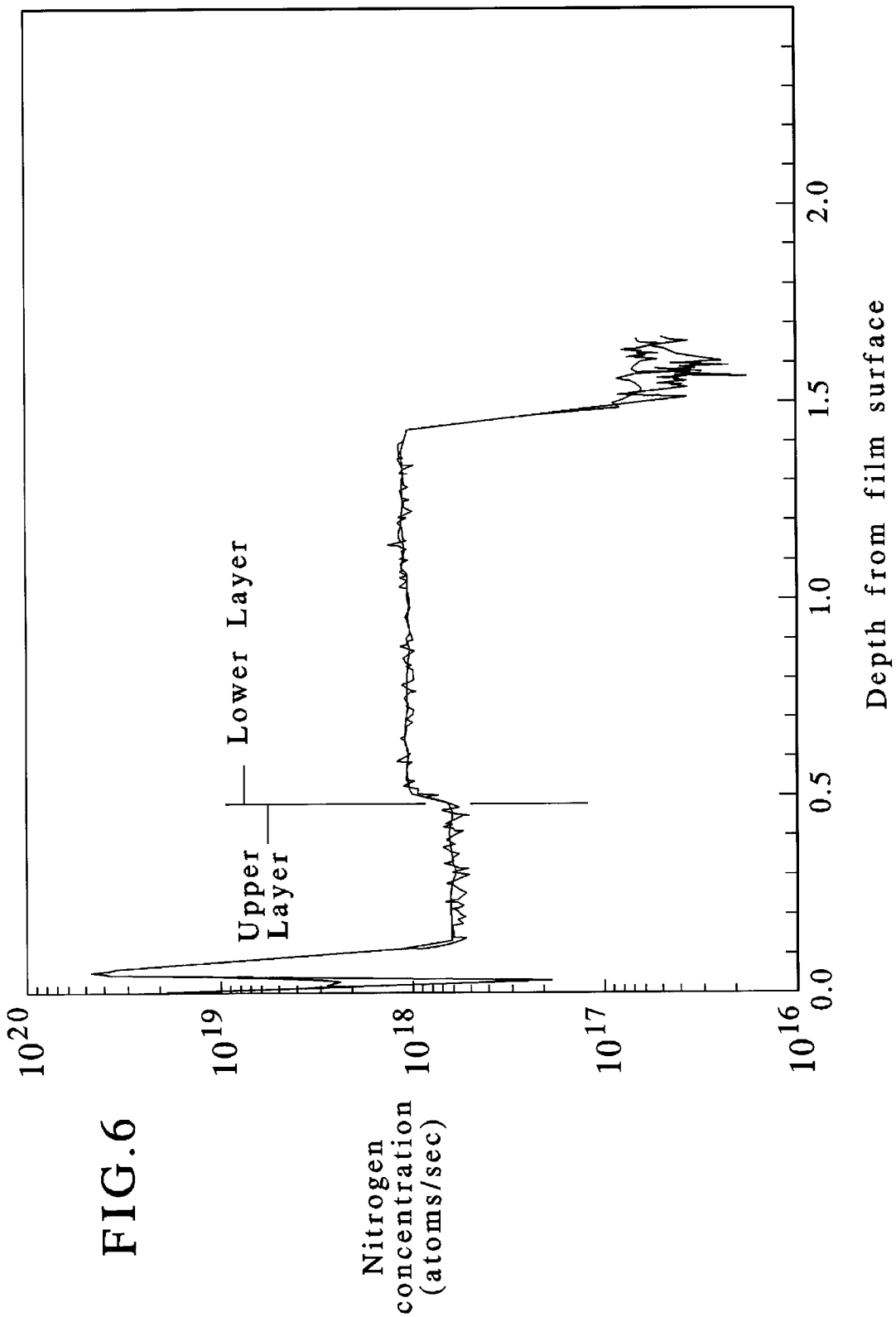
FIG. 6 is a diagram showing a distribution of nitrogen concentration in the deposited film of a nitrogen-doped II-VI group compound semiconductor.

FIG. 6 shows a SIMS (Secondary Ion Mass Spectroscopy) profile of nitrogen atom concentrations in the depth of a nitrogen-doped ZnSe film that was grown to a thickness of 1.5 $\mu$m on a GaAs substrate.

In this case, the horizontal axis of the graph represents the depth of the ZnSe film from the surface thereof. The measured specimen was formed by depositing ZnSe initially in a lower layer on a GaAs substrate without an electric field applied, and then depositing ZnSe in an upper layer (having a thickness of 0.5 $\mu$m) on the lower layer while an electric field of 100 V/cm was being applied. Nitrogen concentration [N] and effective acceptor concentrations [Na—Nd] (Na represents the acceptor concentration and Nd the donor concentration) in the upper and lower layers are shown in a table of FIG. 7.

In this case, the rate of flow of nitrogen was 0.20 sccm, the diameter of the plasma outlet 48 of the plasma generation source 44 was 2.0 mm, and the anode current IA was 1.5 mA.

A review of FIG. 6 indicates that when an electric field is applied, the nitrogen concentration [N] in the crystal is reduced, and nitrogen ions are removed by the electric field. When the electric field was applied, the effective acceptor concentration [Na—Nd] increased from $2.2 \times 10^{17}$ cm$^{-3}$ which is a value at the time no electric field was applied to $3.5 \times 10^{17}$ cm$^{-3}$, and the percentage of activated nitrogen atoms increased from 20% to 55%, as shown on the table 1.

Figure 8:
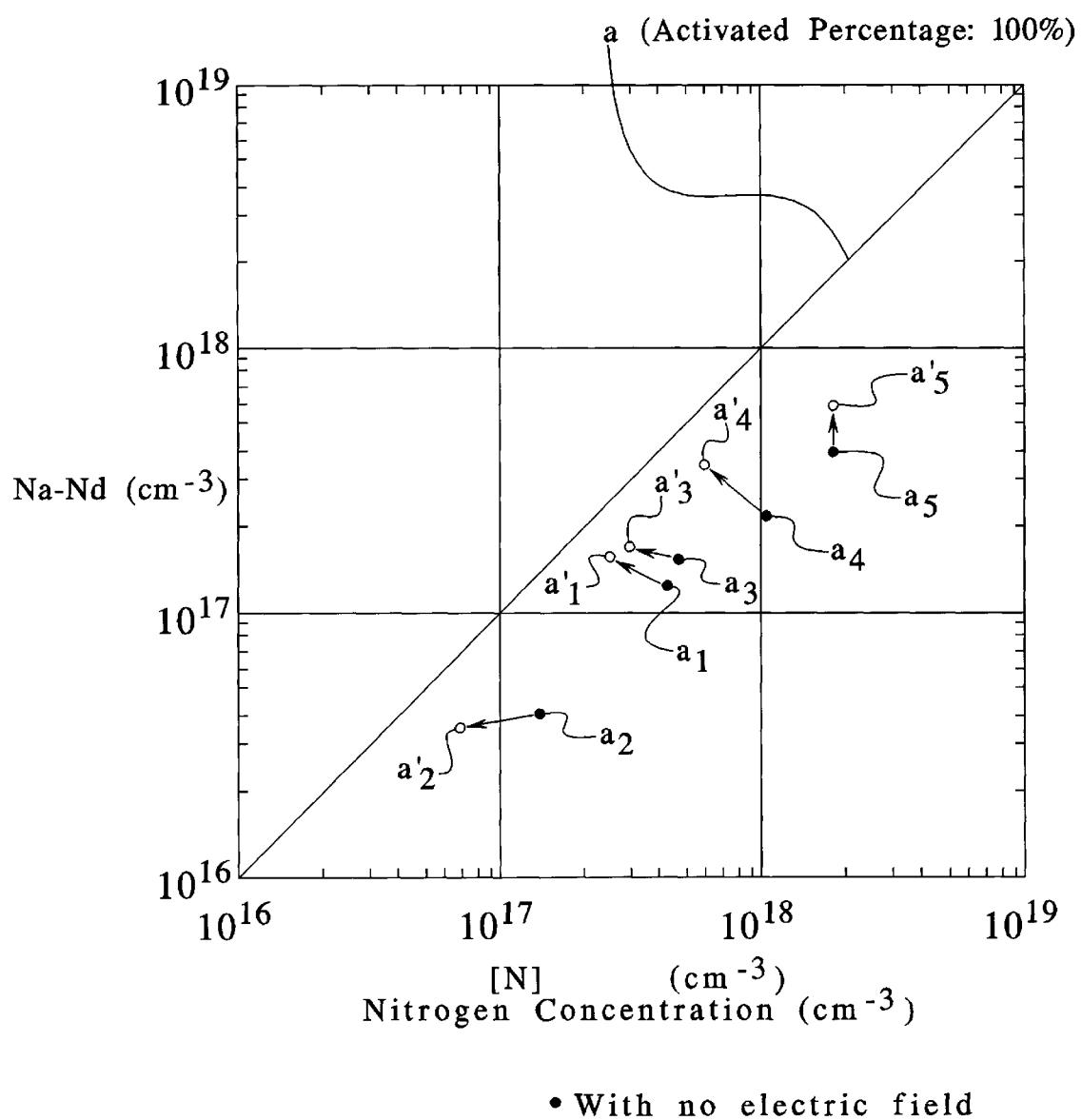
FIG. 8 is a graph showing measured results of concentrations of nitrogen in ZnSe and concentrations of an effective acceptor which are measured with and without the application of an electric field.

Specimens 1 to 5 were produced by depositing a ZnSe film on a GaAs substrate under different conditions on the MBE apparatus shown in FIG. 1. FIG. 8 shows the relationship measured according to SIMS between nitrogen concentration [N] and effective acceptor concentrations [Na—Nd] in upper layers that were deposited while an electric field of 100 V/cm was applied by the electric field applying means 50 and lower layers that were deposited while no electric field was applied by the electric field applying means. In FIG. 8, a straight line "a" represents an activated percentage of 100%, solid circles $a_1$ to $a_5$ represent measured data in the upper layers of the specimens 1 to 5 deposited while no electric field was applied, and open circles $a_1'$ to $a_5'$ represent measured data in the upper layers of the specimens 1 to 5 deposited while an electric field was applied.

It is known that the value of [Na—Nd] is saturated at about $5 \times 10^{17}$ cm$^{-3}$ when doping nitrogen with an ECR plasma generation source according to the MBE process. FIG. 8 also indicates that the value of [Na—Nd] is saturated at about $5 \times 10^{17}$ cm$^{-3}$.

A table 2 of FIG. 2 illustrates the effective acceptor concentrations [Na—Nd], the nitrogen concentrations [N] and the activated percentages in the upper and lower layers of the specimens 1 to 5 deposited with and without the application of a voltage.

Figure 10:
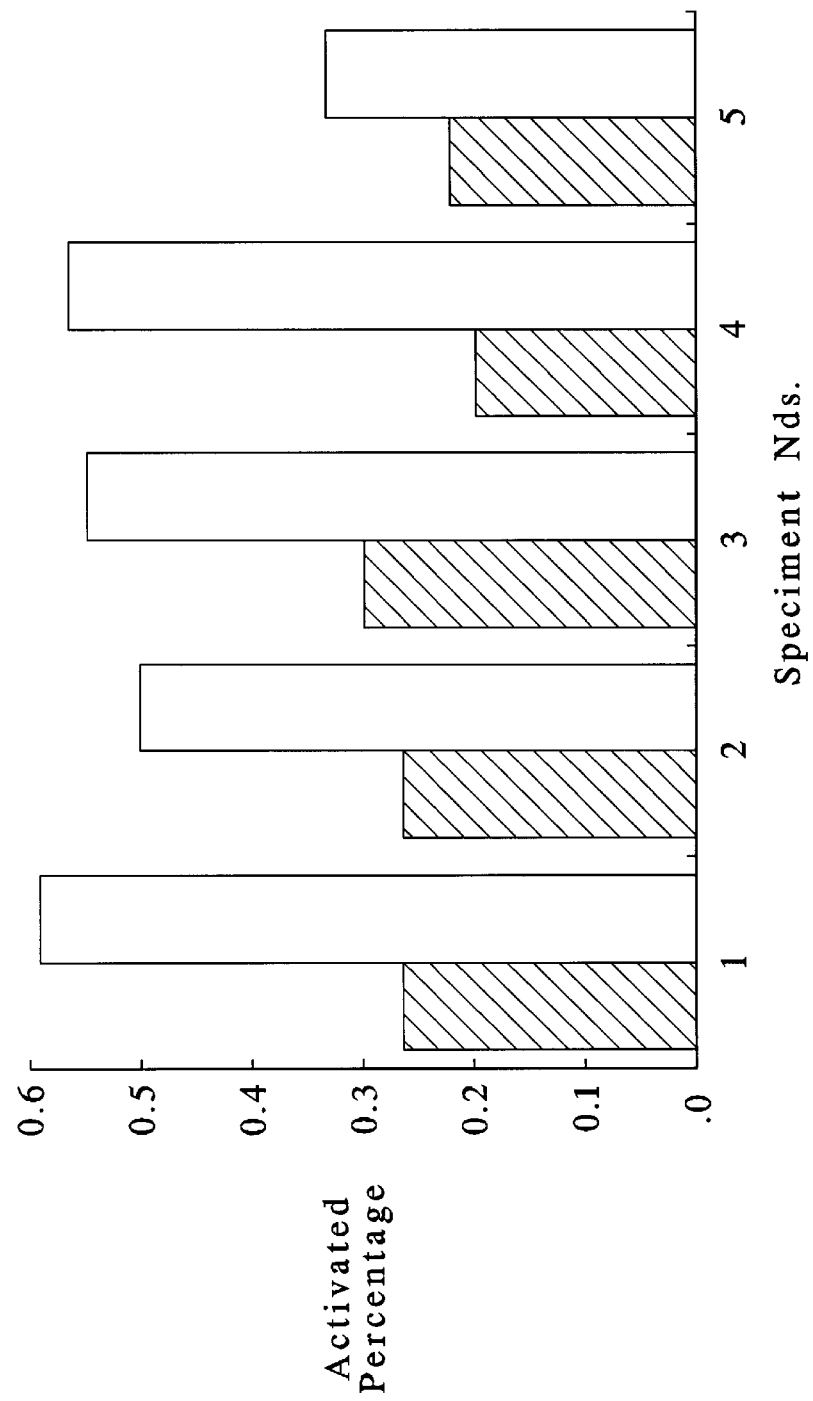
FIG. 10 is a graph showing, for comparison, percentages of activated nitrogen atoms in deposited films of a nitrogen-doped II-VI group compound semiconductor with and without the application of an electric field.

The activated percentages in the upper and lower layers of the specimens 1 to 5 deposited with and without the application of a voltage are shown by blank and hatched bars in FIG. 10. It can be seen from FIGS. 8 and 10 that the activated percentage is much greater when a ZnSe film is deposited with the application of a voltage than when a ZnSe film is deposited without the application of a voltage, and the activated percentage achieved at the time when a film is deposited with the application of a voltage reaches nearly 60%. This indicates a reduction of point defects caused in the crystal by nitrogen atoms that are not activated, and as described later on, improves an electric characteristic (mobility) and an optical characteristic (emission intensity in a semiconductor light-emitting device), i.e., improves crystallinity.

A table of FIG. 11 shows the measured mobility of electrons in a p-type ZnSe film that was epitaxially deposited while an electric field of 100 V/cm was being applied by the charged particle removing means 50 shown in FIG. 1 and a similar p-type ZnSe film that was epitaxially deposited while no electric field was being applied according to the conventional MBE process shown in FIG. 17. In the experiment, the nitrogen gas supplied to the ECR cell, i.e., the plasma generation source 44, at a rate of 0.10 sccm, the anode current IA was 35 mA, and the film thickness was 1.2 $\mu$m.

It will be understood from this table that the mobility of electrons in the ZnSe film deposited by the method according to the present invention increased to about twice the mobility of electrons in the ZnSe film deposited by the conventional method, and hence the ZnSe film deposited by the method according to the present invention has improved crystallinity.

Figure 12:
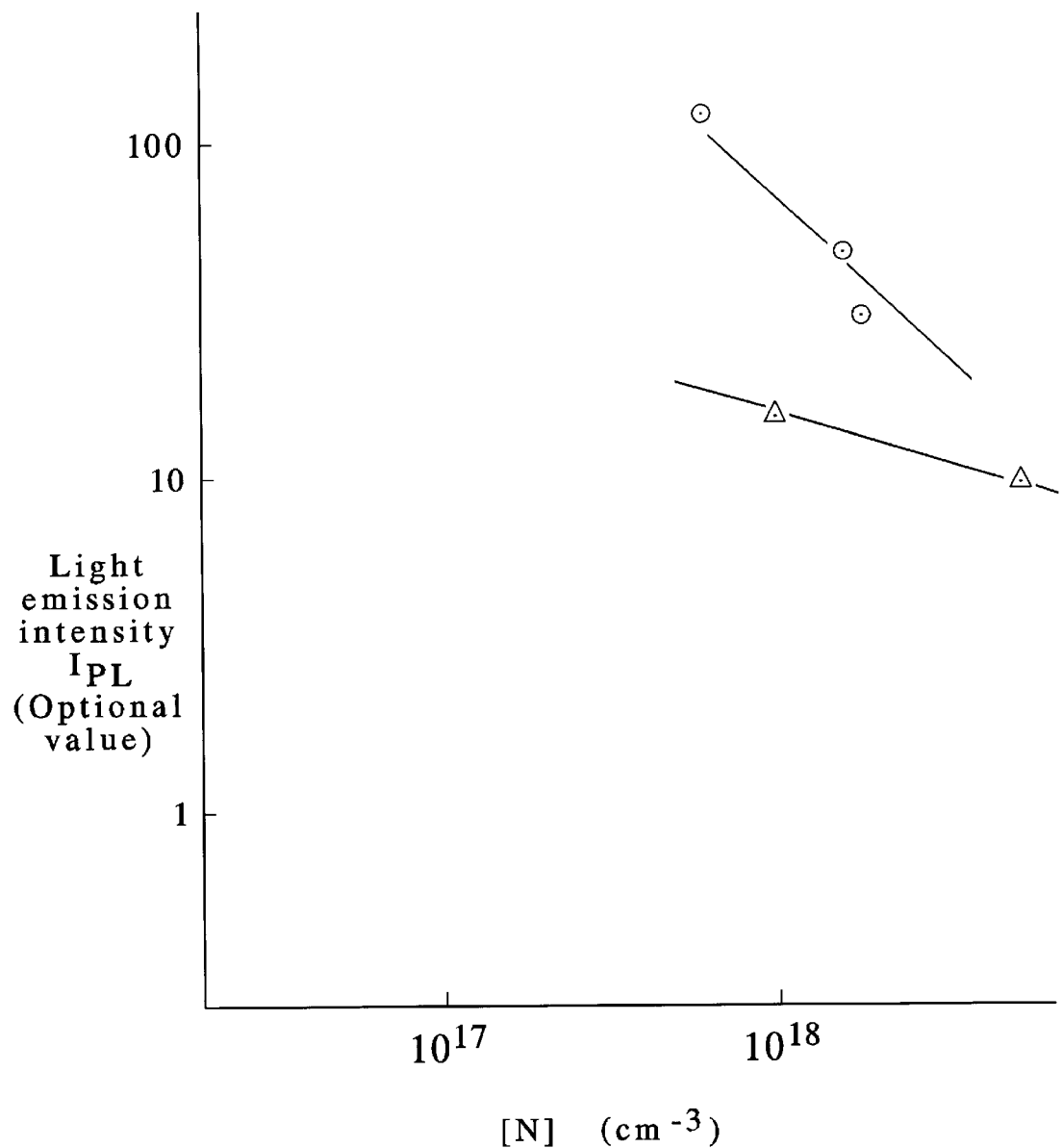
FIG. 12 is a graph of emission intensities measured by a photoluminescence process of deposited films of a nitrogen doped II-VI group compound semiconductor with and without the application of an electric field.

FIG. 12 shows optical characteristics of a p-type ZnSe film that was epitaxially deposited while an electric field of 100 V/cm was being applied by the plasma generating apparatus according to the present invention, i.e., the electric field applying means 50 of the charged particle removing means and a similar p-type ZnSe film that was epitaxially deposited while no electric field was being applied according to the conventional MBE apparatus shown in FIG. 17. The optical characteristics were evaluated by a photoluminescence process and plotted as circular and triangular dots in FIG. 12. The horizontal axis in FIG. 12 represents the nitrogen concentration [N] and the vertical axis represents the photoluminescence emission intensity $I_{PL}$.

A study of FIG. 12 shows that the nitrogen concentration [N] in the film deposited while an electric field was being applied is $1 \times 10^{18}$ cm$^{-3}$ resulting in an emission intensity which is about four times that of the film deposited while no electric field was being applied. If the nitrogen concentration [N] is excessively high, the emission intensity is lowered because the activated percentage is saturated.

It is believed that a nitrogen-doped II-VI group compound semiconductor of excellent crystallinity can be produced by the method according to the present invention because the removal of at least charged particles directed toward the substrate 41 is effective to prevent unnecessary nitrogen ions and many electrons which are produced upon generation of the plasma and are not involved in the electric conductivity of the deposited film, i.e., are not activated, from being oriented toward the substrate 41 and hence from being introduced into or colliding with the deposited film, thereby avoiding introduction of unnecessary foreign matter between atoms of the crystal and hence breakage of the crystal.

The electrodes 51, 52 are supported at a given spaced interval from each other by the insulators 53 of quartz, alumina, boron nitride, or the like, which can withstand high voltages. For example, if the plasma outlet 48 has an inner diameter in the range of from 0.2 mm to 1 mm, the electrodes are disposed in confronting relation to each other at a spaced interval ranging from 1 mm to 5 mm, and a voltage is applied between the two electrodes to produce an electric field ranging from 1 V/cm to 1 kV/cm.

Figure 14:
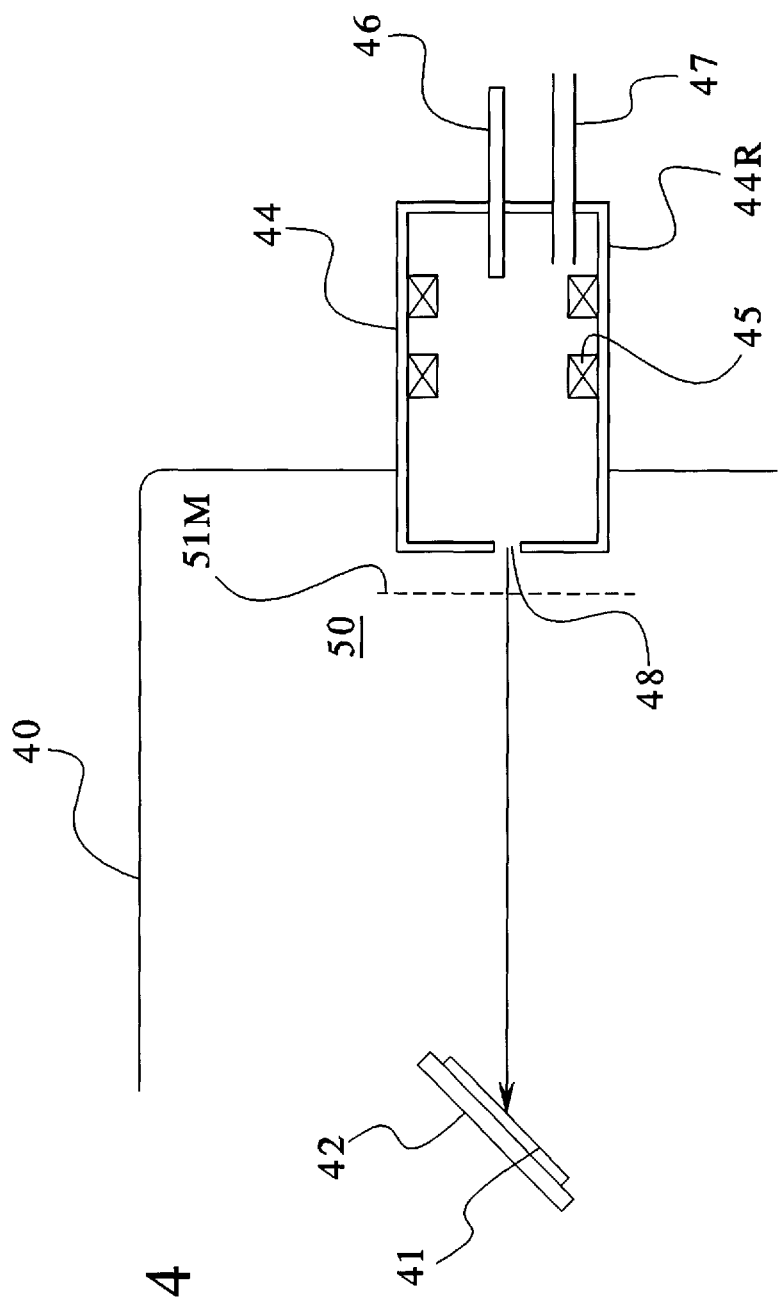
FIG. 14 is a schematic view showing a main portion of still another apparatus for carrying out a method of producing a film of a nitrogen-doped II-VI group compound semiconductor according to the present invention.

In the above embodiments, the electric field applying means, which serves as the charged particle removing means 50, has the electrodes 51, 52 arranged parallel to the direction in which the plasma is applied, for applying an electric field in a direction across the direction in which the plasma is applied. However, an electric field may be applied in a direction parallel to the direction in which the plasma is applied. In this case, as shown in FIG. 1 or FIG. 14, for example, a mesh electrode 51M is disposed between the plasma outlet 48 and the substrate 41 so as to face the plasma outlet 48 such that the plane of the mesh electrode lies across, e.g., perpendicularly to a straight line interconnecting the plasma outlet 48 and the substrate 41, i.e., the direction in which the plasma is applied.

The mesh electrode 51M may be in the form of a metal sheet having a plurality of square holes, each having sides each 0.1 mm to 0.3 mm long, etched therein by photolithography. While a negative voltage of −50 V, for example, is being applied to the plasma generation chamber 44R, a further negative voltage of −100 V, for example, is applied to the mesh electrode 51M. With this arrangement, charged particles, e.g., electrons, are prevented from being delivered out of the plasma generation chamber 44, and nitrogen ions are either attracted or drawn back to the mesh electrode 51M, so that the charged particles and nitrogen ions are prevented from being directed to the substrate 41.

In the above embodiments, the charged particle removing means 50 comprises the electric field applying means. However, the charged particle removing means may comprise a magnetic field applying means for magnetically deflecting charged particles moving in the plasma toward the substrate 41 away from the substrate.

Figure 15:
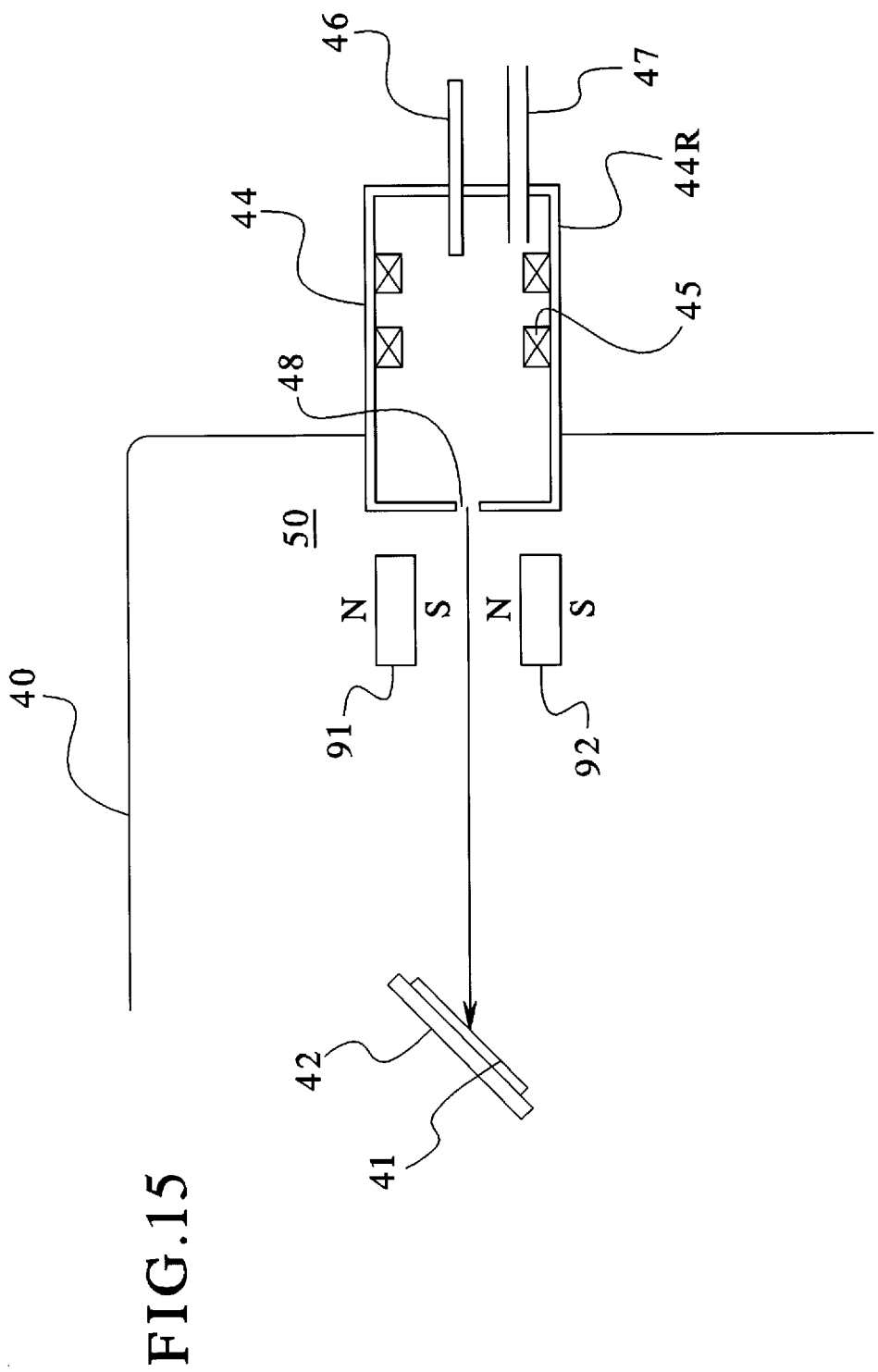
FIG. 15 is a schematic view showing a main portion of yet still another apparatus for carrying out a method of producing a film of a nitrogen-doped II-VI group compound semiconductor according to the present invention.

As shown in FIG. 15 which is a cross-sectional view illustrating a main portion of the magnetic field applying means, the magnetic field applying means may comprise a pair of permanent magnets 91, 92 disposed in confronting relation to each other, one on each side of the path of the plasma between the plasma outlet 48 of the plasma generation chamber 44R and the substrate 41, for applying a magnetic field in a direction across, e.g., perpendicularly to, the direction in which the plasma is applied.

With such a modification, charged particles, i.e., nitrogen ions and electrons, that move in the magnetic field thus generated are deflected under forces produced by the magnetic field. The direction and intensity of the magnetic field and the positional relation of the permanent magnets and their magnetic strength are selected such that these charged particles are deflected away from the substrate 41.

Figure 16:
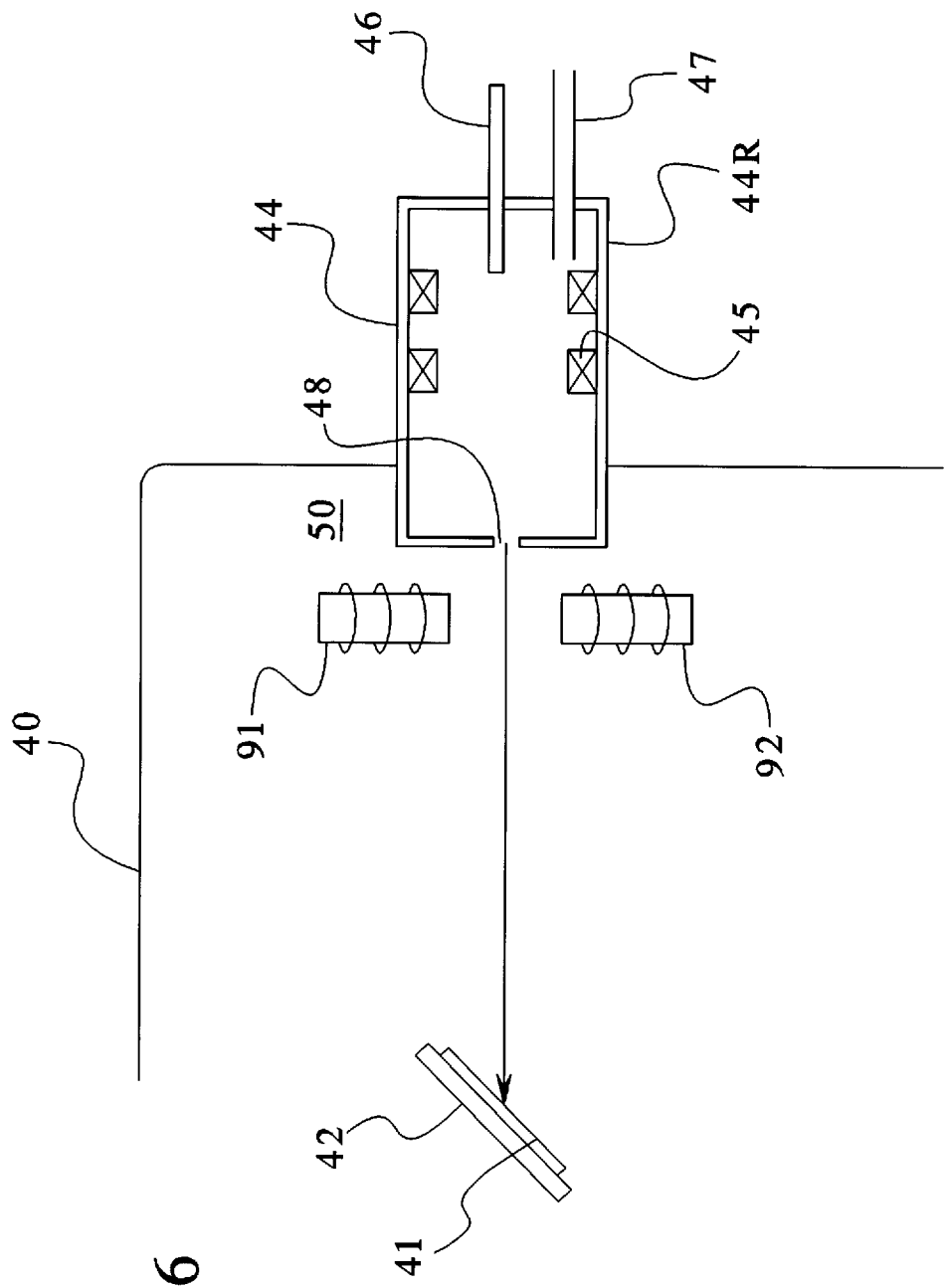
FIG. 16 is a schematic view showing a main portion of a further apparatus for carrying out a method of producing a film of a nitrogen-doped II-VI group compound semiconductor according to the present invention.

Alternatively, as shown in FIG. 16, for example, the magnetic field applying means of the charged particle removing means 50 may not always comprise the above permanent magnets and may comprise a pair of electromagnets 91, 92 each comprising a magnetic core and a coil wound therearound, the electromagnets disposed in confronting relation to each other, one on each side of the path of the plasma between the plasma outlet 48 of the plasma generation chamber 44R and the substrate 41. When the electromagnets are energized, similarly as described before, they produce a magnetic field in a direction across, e.g., perpendicularly to, to the direction in which the plasma is applied.

Also in this case, charged particles, i.e., nitrogen ions and electrons, that move in the magnetic field thus generated are deflected under forces produced by the magnetic field. Further, in this case, the direction and intensity of the magnetic field and the positional relation of the electromagnets and their magnetic strength determined in terms of electric currents supplied thereto are selected such that these charged particles are deflected away from the substrate 41.

As described above, if the charged particle removing means 50 comprises a magnetic field applying means, then the magnetic field produced thereby is selected to have an intensity ranging from $10^{-2}$ to $10^{-3}$ T, for example, in its central region for effectively preventing charged particles from being directed toward the substrate 41.

As described above, low- and high-speed charged particles can be removed from the plasma that is discharged from the plasma generation chamber 44R toward the substrate 41. In addition, the plasma generation source should preferably be arranged to remove high-speed neutral particles as well as charged particles.

Figure 13:
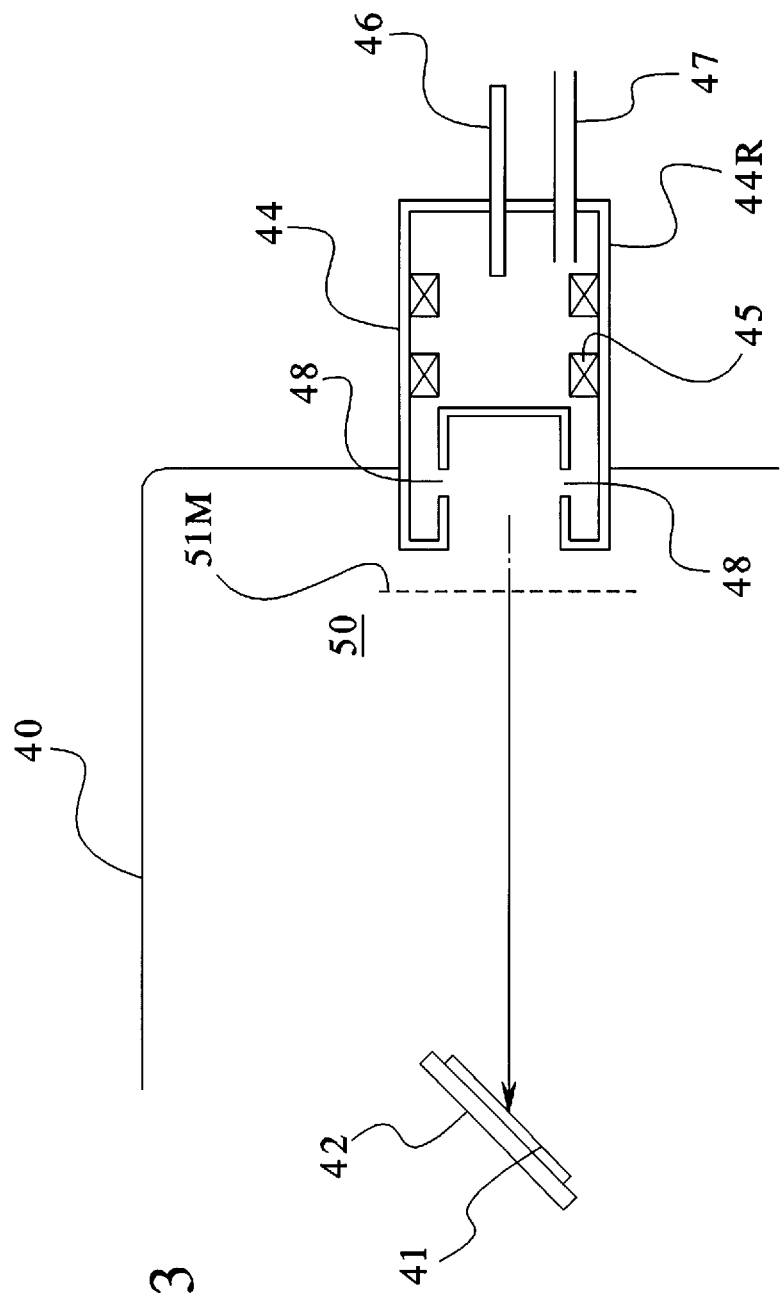
FIG. 13 is a schematic view showing a main portion of another apparatus for carrying out a method of producing a film of a nitrogen-doped II-VI group compound semiconductor according to the present invention.

Specifically, as shown in FIG. 13, for example, the plasma generation chamber 44R has the plasma outlet 48 opening away from the substrate 41. For example, the plasma generation chamber 44R has a recess defined in its side facing the substrate 41 by a pair of confronting side walls each having a plasma outlet 49 which is open, i.e., which has its central axis extend, in a direction substantially perpendicularly to the direction toward the substrate 41.

In this case, since the plasma outlet 8 are open in a direction different from the direction toward the substrate 41, high-speed neutral particles that are generated when nitrogen is converted into a plasma normally move straight in the direction in which the plasma outlets 48 are open, and hence are prevented from being oriented directly toward the substrate 41.

In the arrangement in which the plasma generation chamber 44R has the plasma outlets 48 opening away from the substrate 41, the charged particle removing means 50 is also provided which is in the form of the mesh electrode 51M in the embodiment shown in FIG. 13. The charged particle removing means in combination with the plasma generation chamber may be the electric or magnetic field applying means shown in FIGS. 1, 15, or 16.

Those parts shown in FIGS. 13, 14, 15, and 16 which are identical to those shown in FIG. 1 are denoted by identical reference numerals, and will not be described in detail below.

In the method and apparatus according to the present invention, as described above, charged particles, particularly many electrons, are reliably removed from a plasma of nitrogen by a magnetic field or an electric field for depositing a film of a nitrogen-doped II-VI group compound semiconductor having excellent crystallinity.

A nitrogen-doped p-type ZnSe crystal was deposited on a GaAs substrate while charged particles were being removed by the application of an electric or magnetic field, and the spectrum of light emitted from the deposited nitrogen-doped crystal was observed. Though the spectrum contains a Y-line, its magnitude is considerably smaller than that in the spectrum of light emitted from the crystal that is deposited according to the conventional method. Therefore, it was confirmed that the nitrogen-doped crystal deposited by the method according to the present invention had improved crystallinity.

In the above embodiments, a nitrogen-doped ZnSe film is epitaxially deposited. However, a film of a II-VI group compound semiconductor composed of at least one of II group elements including Zn, Mg, Cd, Hg, Be, etc., and at least one of VI group elements including S, Se, Te, etc., e.g., a film of ZnTe, ZnSe, ZnMgSSe, or the like may be deposited, and the deposited film has excellent crystallinity, i.e., excellent electric and optical characteristics.

Therefore, since the percentage of activated nitrogen atoms is increased and crystal defects are reduced in a film of a p-type II-VI group compound semiconductor, which is shown in FIG. 2, deposited by the method according to the present invention for the fabrication of a semiconductor light-emitting device, the light emission characteristics of the deposited film are improved, the threshold current is reduced, and the service life is extended. According to the present invention, semiconductor light-emitting devices of II-VI group compound semiconductors which are highly reliable and capable of emitting light at short wavelengths can be fabricated with a high yield.

While the plasma generation source 44 generates a plasma by way of ECR excitation in the above embodiments, it may generate a plasma by way of a high-frequency RF excitation.

We claim:

1. A film deposition apparatus comprising:
   a film deposition chamber in which a substrate is introduced;
   at least one Group II element source and at least one Group VI element source, each having a molecular beam outlet within said chamber;
   at least one plasma generation chamber in which a nitrogen gas is introduced, having at least one plasma outlet within said chamber, wherein excited nitrogen gas including a high speed particle is ejected from a said plasma outlet, said at least one plasma outlet opening into said film deposition chamber in a direction different from a direction toward said substrate so that said high speed particle is not ejected directly at said substrate.

2. A film deposition apparatus according to claim 1, wherein the apparatus further comprises a charged particle remover in a path of said excited nitrogen gas.

3. A film deposition apparatus according to claim 2, wherein said charged particle remover comprises a pair of electrodes.

4. A film deposition apparatus according to claim 2, wherein said charged particle remover comprises a mesh electrode.

5. A film deposition apparatus according to claim 2, wherein said plasma generation chamber comprises apparatus applying a magnetic field.

6. A film deposition apparatus according to claim 1, wherein said group II element comprises Zn.

7. A film deposition apparatus according to claim 1, wherein said group VI element comprises Se.

* * * * *